United States Patent
Pankratz et al.

(10) Patent No.: US 10,864,821 B2
(45) Date of Patent: Dec. 15, 2020

(54) OPERATING UNIT FOR A DEVICE, IN PARTICULAR FOR A VEHICLE COMPONENT

(71) Applicant: BEHR-HELLA THERMOCONTROL GMBH, Stuttgart (DE)

(72) Inventors: Harri Pankratz, Bad Sassendorf (DE); Bastian Bandlow, Paderborn (DE); Alexander Beschnitt, Gütersloh (DE); Frank Vogt, Lichtenau-Husen (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 19 days.

(21) Appl. No.: 16/082,806

(22) PCT Filed: Mar. 20, 2017

(86) PCT No.: PCT/EP2017/056555
§ 371 (c)(1),
(2) Date: Sep. 6, 2018

(87) PCT Pub. No.: WO2017/162586
PCT Pub. Date: Sep. 28, 2017

(65) Prior Publication Data
US 2019/0084423 A1   Mar. 21, 2019

(30) Foreign Application Priority Data
Mar. 23, 2016 (DE) .................. 10 2016 204 875

(51) Int. Cl.
*B60K 37/06* (2006.01)
*B60K 37/02* (2006.01)
(Continued)

(52) U.S. Cl.
CPC ............. *B60K 37/06* (2013.01); *B60K 35/00* (2013.01); *B60K 37/02* (2013.01); *G06F 3/016* (2013.01);
(Continued)

(58) Field of Classification Search
CPC ........... B60K 2350/1028; B60K 35/00; B60K 37/06; B60K 37/02; B60K 2370/1438;
(Continued)

(56) References Cited

U.S. PATENT DOCUMENTS

2004/0075676 A1   4/2004  Rosenberg et al.
2015/0035780 A1*  2/2015  Birnbaum ............... G06F 3/016
                                                                345/173
(Continued)

FOREIGN PATENT DOCUMENTS

DE    102008046102 A1    3/2010

*Primary Examiner* — Yaron Cohen
(74) *Attorney, Agent, or Firm* — Christensen, Fonder, Dardi; Diane E. Bennett; Peter S. Dardi

(57) ABSTRACT

The operating unit for a vehicle, in particular for a vehicle component, is provided with a housing (10) which has an operating element (12), such as a display for example, and is designed to be secured in a device, in particular in a vehicle dashboard. The operating element (12) is elastically mounted on the housing (10). An actuator (16) is additionally provided for mechanically exciting the operating element (12) when an operation of the operating element (12) has been detected. Finally, the operating unit also has a vibration compensating mass (20) which can be mechanically excited by the actuator or by one actuator (16) when an operation of the operating element (12) has been detected and/or which is mounted on the housing (10) and can be moved in order to substantially compensate for forces acting on the housing (10) when the operating element (12) is moved.

10 Claims, 3 Drawing Sheets

(51) Int. Cl.
  *G06F 3/01*    (2006.01)
  *G06F 3/0354*  (2013.01)
  *G06F 3/041*   (2006.01)
  *B60K 35/00*   (2006.01)

(52) U.S. Cl.
  CPC .......... *G06F 3/03547* (2013.01); *G06F 3/041* (2013.01); *B60K 2370/143* (2019.05); *B60K 2370/1438* (2019.05); *B60K 2370/158* (2019.05); *B60K 2370/48* (2019.05); *B60K 2370/691* (2019.05); *B60K 2370/816* (2019.05); *H03K 2217/96062* (2013.01)

(58) Field of Classification Search
  CPC ........ B60K 2370/691; B60K 2370/143; B60K 2370/158; B60K 2370/816; B60K 2370/48; G06F 3/016; G06F 3/041; G06F 3/03547; H03K 2217/96062
  See application file for complete search history.

(56) References Cited

U.S. PATENT DOCUMENTS

2016/0026317 A1\* 1/2016 Bigand ................. G06F 3/0414
                                                      345/173
2016/0077588 A1\* 3/2016 Adams .................. B60K 37/00
                                                      345/174
2016/0334871 A1\* 11/2016 Levesque ............. G06F 3/0416

\* cited by examiner (State of the art)

OPERATING UNIT FOR A DEVICE, IN PARTICULAR FOR A VEHICLE COMPONENT

This application is a National Stage filing of PCT Application No.: PCT/EP2017/056555, filed Mar. 20, 2017, which claims priority to German Patent Application No.: DE 10 2016 204 875.9, filed Mar. 23, 2016, both of which are incorporated herein by reference.

The invention relates to an operating unit for a device which particularly is a vehicle component. Particularly, the invention relates to operating units with force compensation in active haptic feedback occurring by mechanical excitation of an operating element of the operating units, so that vibrations of the operating element caused by the active haptic feedback are compensated or at least dampened and thus will have no effect or merely a reduced effect on the environment of the operating unit (e.g. instrument panel).

Display assemblies in vehicles are often provided with an active haptic feedback so that the user will receive a—particularly tactile—confirmation of an operating input. In this respect, it is not desired that the actuation of the feedback could generate an inadmissible dynamic force transmission into the environment of the operating unit such as e.g. an instrument panel or a vehicle because, depending on the installation situation, this force transmission may lead to parasitic noise or vibration within the vehicle. Such a mechanical decoupling is all the more important, the larger the mass of the mechanically excited operating element is.

Further, the haptic feedback shall be largely independent from the elasticity of the mounting in the vehicle.

Figure 1:
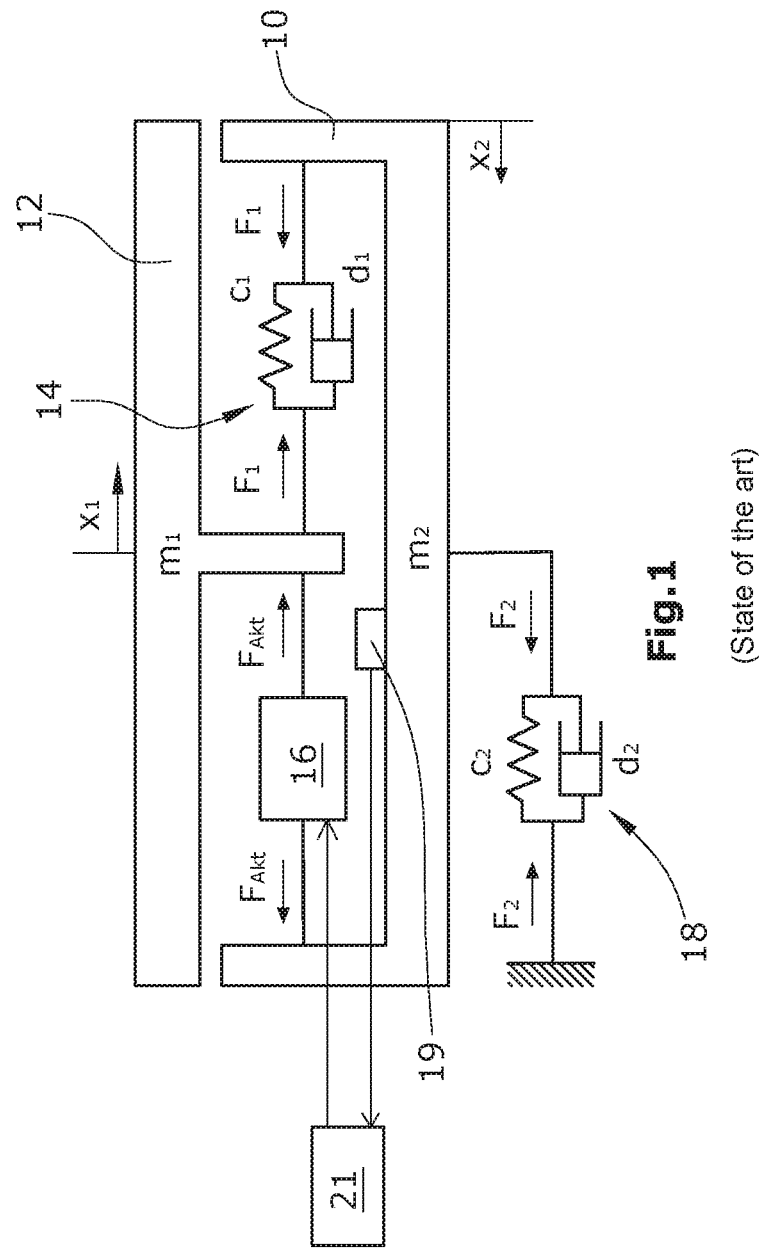

A device provided with an active haptic feedback substantially consists of an operating element with an operating field (e.g. touchscreen or display) that, via a spring system, is elastically mounted to the device housing, an actuator for deflection of the operating element, and a housing that is fixedly installed in the vehicle. In FIG. 1, the forces at work in such a device configuration are represented. Reference numeral 10 indicates the housing with the mass $m_2$. The connection or attachment of the housing 10 to the device environment (e.g. instrument panel) is symbolized by the spring damping system. The actuator is indicated by 16 and will mechanically excite the display or operating element 12 having the mass $m_2$. The movably mounted operating element 12 is mounted to the housing 10 in a spring-elastic manner, which is symbolized by the spring-damping system 14. A sensor 19 detects an actuation of the operating element 12 (force sense function) and transmits a signal to the evaluation and control unit 21 which controls the actuator 16 (force feedback function).

For generating the haptic feedback, the display will be deflected from its rest position with a specific course of path $x_1(t)$. The display acceleration $a_1(t)$ herein can assume values of more than 30 m/s², which, with a moved display mass $m_1$ of more than 0.5 kg and a normally small housing mass $m_2$, will result in a non-negligible dynamic force $F_2(t)$ acting on the housing fastening structure in the vehicle.

In case of a "stiff" housing support or fastening structure e.g. on the instrument panel (stiff spring system $c_2$, $d_2$), this temporally fast-changing force may happen to cause inadmissible noises or vibrations in the vehicle.

In case of a "soft" fastening of the housing (soft spring system $c_2$, $d_2$), however, compliance with the mounting tolerances of the device in the vehicle will pose difficulties. Further, due to the presence of a further degree of freedom, namely the housing movement $x_2(t)$ and thus also additional natural frequencies in the system, the adjusting of the required actuator force development $F_{Akt}(t)$ will, depending on the circumstances, not be possible.

From US-A-2004/0075676, there is known a laptop with haptic feedback for the touchpad of the laptop. Herein, the touchpad is mechanically excited by a piezo actuator and itself is resiliently supported on the housing of the laptop. The piezo actuator has a counterweight suspended on it which, as a result of the expansion of the piezo actuator when the latter is driven, will be displaced oppositely to the movement of the touchpad. By way of this approach, however, it is not all too easily possible to realize a pulse compensation and a compensation of the dynamic forces within the housing of the laptop.

It is an object of the invention to provide a concept for an operating unit with active haptic feedback that is improved with respect to the generation of parasitic noises and vibrations, respectively.

For achieving the above object, there is proposed, according to the invention, an operating unit for a device, e.g. for a vehicle component, particularly a man-machine interface (MMI or HMI), said operating unit being provided with
- a housing which comprises an operating element having an operating panel such as e.g. a touchscreen or touchpad or display, and which is provided for attachment in a device, particularly in a vehicle dashboard or vehicle center console,
- wherein the operating element is elastically mounted on the housing,
- a sensor for detection of an actuation of the operating element,
- an actuator for mechanical excitation of the operating panel occurring upon detection of an operation of the operating element, and
- a compensating weight,
- wherein the compensating weight is adapted to be mechanically excited by said, or an, actuator upon detection of an operation of the operating element, and is elastically mounted in and/or on the housing and/or is elastically mounted at the operating element,
- wherein the compensating weight is movable to substantially compensate a movement of the housing upon activation of the actuator mechanically exciting the operating element, or
- wherein, in other words, the compensating weight is movable in a manner substantially compensating and/or preventing and/or damping the forces acting on the housing due to the movement of the operating element occurring upon activation of the actuator, namely particularly actively by the actuator exciting the operating element or by an actuator assigned to the compensating weight.

Thus, according to the invention, the compensating weight is elastically fastened to the housing. The compensating weight is moved either by the actuator exciting the operating element or by a separate actuator assigned to the compensating weight.

It is suitable of if the compensating weight is designed as a part of the actuator mechanically exciting the operating element, e.g. as an integral component of the stator of a tie-rod or plunger-coil electromagnet actuator. Instead of being designed as such an electromagnet actuator, the actuator can also be designed as a piezo actuator. However, the compensating weight can also be provided as an element separate from said actuator. In each case, the compensating weight is elastically supported on the housing and thus is elastically propped relative to the housing.

Particularly, it is of advantage if the compensating weight is movable with a phase shift of substantially 180° and thus in the opposite direction to the excitation movement of the operating element wherein the movement stroke of the compensating weight is selected under consideration of at least the relation of the mass of the operating element to the mass of the compensating weight. If, for instance, the mass of the compensating weight is half the mass of the operating element, the movement stroke of the compensating weight is twice as large as the movement stroke of the operating element. In practice, the operating element is deflected e.g. by 0.1 mm or by a few 1/10 mm. If the mass of the operating element is e.g. 0.5 kg, it would be possible, for the inventive compensation of forces acting from the operating unit toward the outside, to use e.g. a compensating weight having a mass of 50 g and a movement stroke of 1 mm or a few mm.

Further, it is of advantage for a largest possible compensation of forces if the natural frequencies of the spring-mass damping system of the elastic coupling of the operating element to the housing and the natural frequency of the spring-mass damping system of the elastic coupling of the compensating weight to the housing or to the operating element are equal or substantially equal. Herein, in the framework of the invention, the phrase " substantially equal" is to be understood as denoting a deviation from the natural frequency of 50%, particularly 40%, preferably 30% and most preferably 20% or 10%.

The operating unit of the invention can be designed as display and operating unit.

Figure 2:
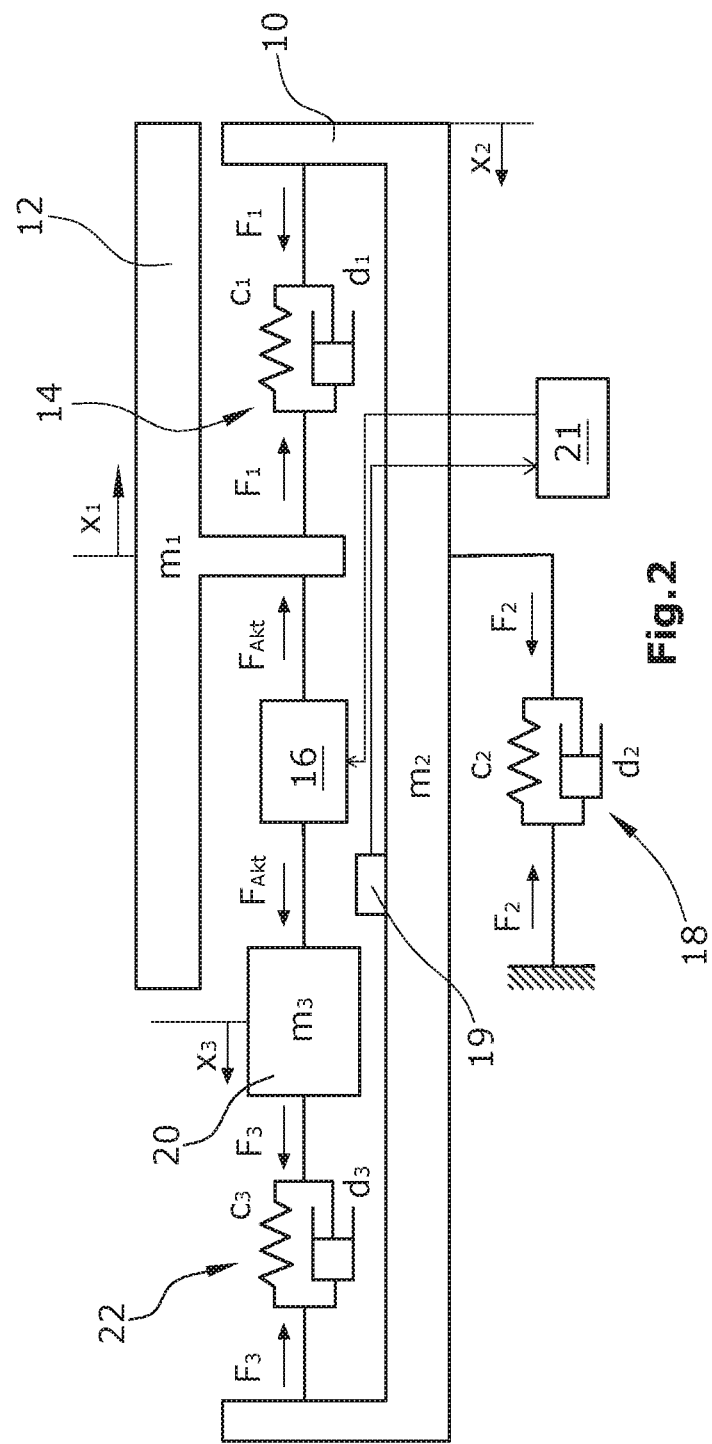
Figure 3:
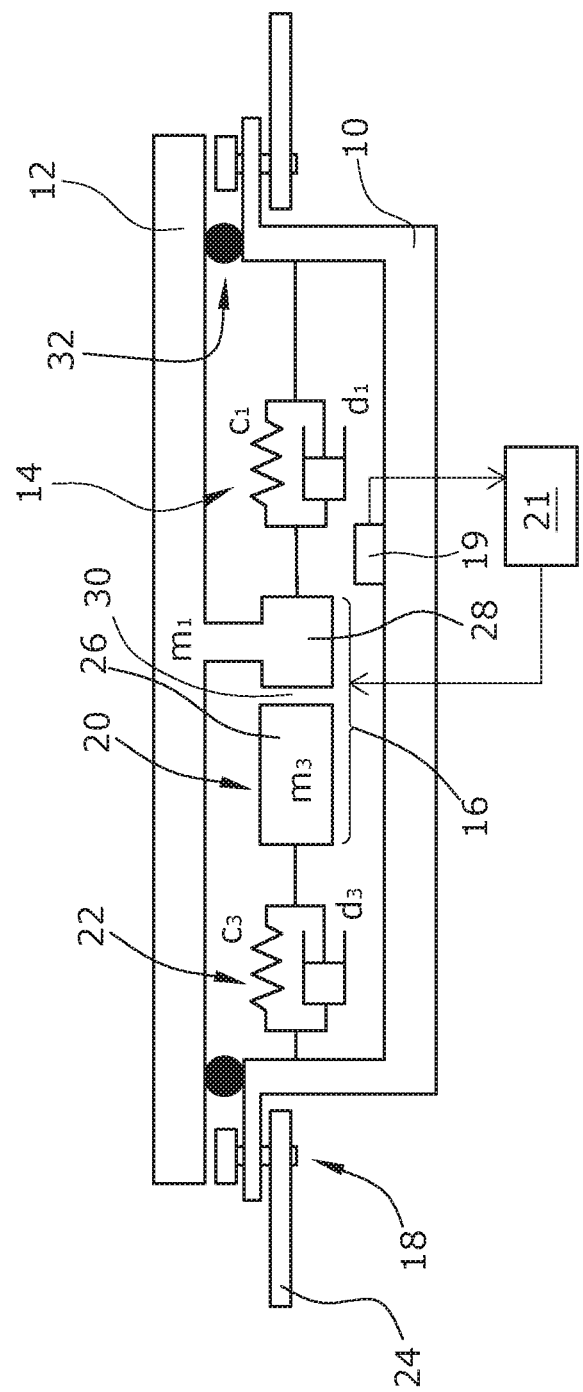

The invention will be described hereunder in greater detail and with reference to the drawing. In the individual Figures, the following is shown:

FIG. 1 is a schematic representation of the forces occurring in an operating unit with active haptic feedback according to the state of the art, FIG. 2 is a schematic representation of the forces occurring when using a compensating weight as a compensating mass in the manner provided by the invention, and FIG. 3 is a schematic representation of the design of a counterforce-free haptic feedback in an operating unit.

According to the invention, there is proposed the use of an elastically supported (see spring-mass damping system 22) movable countermass 20 between the actuator 16 and the housing 10 for balancing the forces acting on the housing 10. The actuation of the operating element 12 is detected by means of the actuation sensor 19. Thereupon, via an evaluation and control unit 21 which receives signals from the actuation sensor 19 and transmits control signals to the actuator 16, the actuator 16 will be controlled.

In case of a corresponding design of the additional spring-mass damping system 22 and $c_3$, $d_3$, $m_3$, respectively, the resulting force $F_2(t)$ acting on the vehicle can be eliminated. (The static forces generated by gravitation do not play a role in the generating of noises or vibrations).

For a randomly predetermined display deflection $x_1(t)$, the deflection $x_2(t)$/motion of the device housing and thus also the force $F_2(t)$ acting on the device fastening structure can be eliminated under the following conditions:

$$c_3 = c_1 \frac{m_3}{m_1}, \quad d_3 = d_1 \frac{m_3}{m_1}$$

From this, there results the deflection of the countermass 20:

$$x_3(t) = x_1(t) \frac{m_1}{m_3}$$

Under these conditions, also the elasticity of the device fastening structure 18 will have no influence on the haptic feedback. The countermass 20 and $m_3$, respectively, is normally restricted by the demands posed on the installation space and is smaller than the display mass $m_1$. In the ideal case, it can be realized as a part of the actuator 16.

The present invention makes it possible
to generate a haptic feedback on mass-carrying surfaces without causing effects of dynamic forces on the environment,
to generate a haptic feedback in an operating device that is independent from the elasticity of the device fastening structure.

In FIG. 3, a device with counterforce-free haptic feedback is schematically outlined.

In the illustrated example, the actuator 20 is designed as a tie-rod electromagnet and comprises a stack of stator laminations, elastically supported on housing 10 and having an actuator coil, i.e. a stator 26 and an armature core tightly coupled to the operating element 12, i.e. an armature 28. The stator 26 forms a movable countermass 20 or comprises the same. When setting the air gap, shown at 30, in the tie-rod electromagnet, the maximum deflection of the display 10 and of the countermass 20 relative to each other has to be considered. The stator 26 is supported elastically (spring-mass damping system 22) on the housing 10 but alternatively can also be elastically coupled to the operating element 12. The operating element guide means is schematically represented at 32. The housing 10 is fastened to the vehicle 24 (e.g. at the instrument panel of the vehicle).

The invention has been described above by way of an operating unit for use in a vehicle but, as initially mentioned, is also applicable quite generally for operating units all of types of devices or systems. In devices that comprise more than one operating surface with haptic feedback, each operating surface can be mechanically excited independently from the at least one other operating surface in the manner provided by the invention. Thus, each operating surface comprises its own dedicated balance mass so as to be able to compensate for device forces and movements acting toward the outside, which are induced by mechanical excitation of any one of the operating surfaces.

LIST OF REFERENCE NUMERALS 10 housing
12 operating element
14 spring damping system of the elastic coupling of the operating element to the housing
16 actuator
18 spring damping system of the (elastic) coupling of the housing to the vehicle
19 actuation sensor
20 counterweight
21 evaluation and control unit
22 spring damping system of the elastic coupling of the counterweight to the housing and/or the operating element
24 vehicle or operating panel of the vehicle
26 stator of the tie-rod electromagnet designed as actuator 28 armature of the tie-rod electromagnet
30 air gap of the tie-rod electromagnet
32 guide means of the operating panel for the motion upon haptic feedback
$m_1$ mass of the operating panel
$x_1(t)$ deflection of the operating panel
$F_{Akt}(t)$ actuator force development
$F_1(t)$ force of the operating panel acting on the housing 10 upon excitation of the operating panel ($F_1(t)=F_{Akt}-m_1 \times a_1$)
$c_1$ spring constant of the elastic coupling of the operating panel on the housing
$d_1$ damping of the elastic coupling of the operating panel on the housing
$m_2$ mass of the housing
$x_2(t)$ deflection of the housing resulting from the force exerted by the mechanically excited operating panel
$F_2(t)$ force acting on the housing fastening structure
$m_3$ mass of the counterweight
$x_3(t)$ deflection of the counterweight
$F_3$ force acting on the housing by the counterweight
$c_3$ spring constant of the elastic coupling of the counterweight to the housing
$d_3$ damping of the elastic coupling of the counterweight to the housing

The invention claimed is:

1. An operating unit for a device comprising—an operating element having an operating panel, —a housing wherein the housing is attached to the device and wherein the operating element is elastically mounted on the housing, —a sensor for detection of an actuation of the operating element, —an actuator for mechanically driving the operating element upon its actuation, and —a compensating weight, wherein the compensating weight is adapted to be mechanically driven by said actuator upon detection of the actuation of the operating element and wherein the compensating weight has an elastic mounting to the housing and/or an elastic mounting to the operating element, wherein the compensating weight is configured to move to substantially compensate for a relative movement of the housing and the operating element to correspondingly dampen transmission of dynamic forces between the housing and the operating element, wherein the compensating weight moves with a phase shift of substantially 180° to the relative movement of the operating element, wherein a movement stroke of the compensating weight is selected under consideration of at least a ratio of the mass of the operating element to the mass of the compensating weight.

2. The operating unit according to claim 1, wherein the compensating weight is separated from said actuator or from an actuator.

3. The operating unit according to claim 1, wherein the operating element inclusive of its elastic mounting to the housing has a first eigen frequency and the compensating weight inclusive of its elastic mounting to the operating element and/or to the housing has a second eigen frequency, wherein the first and the second eigen frequencies are equal or substantially equal.

4. The operating unit according to claim 1, wherein the actuator is a tie-rod or plunger-coil electromagnet comprising a stator and an armature, wherein the armature or the stator is kinematically coupled to the operating element, and the stator or the armature is kinematically coupled to the compensating weight.

5. The operating unit according to claim 4, wherein the stator and/or the armature comprises the compensating weight.

6. The operating unit according to claim 1, wherein the operating element further comprises a display function.

7. The operating unit according to claim 1, wherein the device is a man-machine interface in a vehicle component.

8. The operating unit according to claim 7, wherein the vehicle component is a dashboard and/or a center console.

9. The operating unit according to claim 1, wherein the operating panel is a touchscreen, a touchpad, a display or a combination thereof.

10. The operating unit according to claim 1, wherein the compensating weight is part of said actuator mechanically exciting the operating panel.

* * * * *